United States Patent
Murazawa et al.

(10) Patent No.: US 12,270,790 B2
(45) Date of Patent: Apr. 8, 2025

(54) INSPECTION APPARATUS

(71) Applicant: DISCO CORPORATION, Tokyo (JP)

(72) Inventors: Naoki Murazawa, Tokyo (JP);
Kunimitsu Takahashi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 185 days.

(21) Appl. No.: 18/172,604

(22) Filed: Feb. 22, 2023

(65) Prior Publication Data
US 2023/0280249 A1    Sep. 7, 2023

(30) Foreign Application Priority Data

Mar. 2, 2022 (JP) ................................. 2022-031626

(51) Int. Cl.
*G01N 3/06* (2006.01)
*G01N 3/08* (2006.01)
*H01L 21/683* (2006.01)

(52) U.S. Cl.
CPC ............... *G01N 3/068* (2013.01); *G01N 3/08* (2013.01); *G01N 2203/0017* (2013.01); *G01N 2203/0282* (2013.01); *G01N 2203/0286* (2013.01); *G01N 2203/0494* (2013.01); *G01N 2203/0641* (2013.01); *H01L 21/6836* (2013.01)

(58) Field of Classification Search
CPC ......... H01L 21/67253; H01L 21/67132; H01L 21/67288; H01L 21/6836; H01L 2221/68327; G01N 3/08; G01N 3/068; G01N 2203/0282; G01N 2203/0494; G01N 2203/0286; G01N 2203/0641; G01N 2203/0017
See application file for complete search history.

(56) References Cited

U.S. PATENT DOCUMENTS

| | | | |
|---|---|---|---|
| 6,209,532 B1* | 4/2001 | Arnold | B28D 5/0094 125/35 |
| 9,683,930 B2* | 6/2017 | Freudenthal | G01N 21/23 |

(Continued)

FOREIGN PATENT DOCUMENTS

JP          06177243 A    6/1994

OTHER PUBLICATIONS

Nishida Tetsuro "Profile Recognition System for Semiconductor Wafer", Sep. 16, 1994, JP H06258056 A. (Year: 1994).*

*Primary Examiner* — Sang H Nguyen
(74) *Attorney, Agent, or Firm* — Greer Burns & Crain Ltd.

(57) ABSTRACT

Apparatus for inspecting the tension of a tape adhered to an annular frame having, in the center thereof, an opening for accommodating a wafer includes: a frame support section that supports the annular frame, a light source that applies light toward the tape, an imaging camera that captures, through the tape, the light applied from the light source, a first polarizing plate disposed between the tape and the light source, and a second polarizing plate disposed between the tape and the imaging camera and positioned so as to shield the light of linearly polarized light transmitted through the first polarizing plate. If distortion is generated in a polarization plane of the light due to application, onto the tape, of the light of the linearly polarized light transmitted through the first polarizing plate, the light is transmitted through the second polarizing plate, and the imaging camera images the transmitted light.

4 Claims, 5 Drawing Sheets

(56) References Cited

U.S. PATENT DOCUMENTS

| | | | |
|---|---|---|---|
| 2007/0273865 A1* | 11/2007 | Niitsu | G01L 5/0047 |
| | | | 356/33 |
| 2009/0011525 A1* | 1/2009 | Yamamoto | H01L 21/67288 |
| | | | 257/E21.53 |
| 2010/0078114 A1* | 4/2010 | Yamamoto | H01L 21/67132 |
| | | | 156/379 |
| 2017/0243341 A1* | 8/2017 | Takeda | G01N 21/958 |
| 2018/0197765 A1* | 7/2018 | Sekiya | H01L 22/26 |
| 2020/0333261 A1* | 10/2020 | Sugiyama | G01N 21/9501 |
| 2020/0365430 A1* | 11/2020 | Negishi | H01L 21/681 |

* cited by examiner

INSPECTION APPARATUS

BACKGROUND OF THE INVENTION

Field of the Invention

The present invention relates to an inspection apparatus for inspecting the tension of a tape adhered to an annular frame having, in the center thereof, an opening for accommodating a wafer.

Description of the Related Art

A wafer formed on a front surface thereof with a plurality of devices such as integrated circuits (ICs) and large-scale integration (LSI) circuits partitioned by a plurality of planned dividing lines (streets) is accommodated in an opening of an annular frame formed with the opening in the center thereof, and, in the state of being united by a tape, is divided into individual device chips by a dicing apparatus or a laser processing apparatus, and the divided device chips are used for electric apparatuses such as mobile phones and personal computers (refer to, for example, Japanese Patent Laid-open No. Hei 06-177243).

In addition, since the wafer is supported by the annular frame through the tape, even after divided into the individual device chips, the wafer in the state of maintaining the form of a wafer is conveyed to a next step, for example, a pick-up step.

SUMMARY OF THE INVENTION

Incidentally, in a case where the tape for supporting the wafer is adhered to the above-mentioned annular frame, the tape is adhered to the opening of the annular frame by use of an unillustrated tape applying machine or the like. However, due to a trouble in the tape applying machine or a problem on the tape side, the tape may not be adhered to the annular frame with a uniform tension but may be adhered to the annular frame in a twisted state. In a case where the wafer is supported in a state in which the tape is not adhered to the annular frame with a uniform tension as described above, if the wafer is divided into individual device chips in this state, there may occur various problems such as a problem that the device chips would be positionally deviated, a problem that the devices would fall off, a problem that the tape would be peeled off from the annular frame, and, further, a problem that the device chips could not be picked up properly in a pick-up step. Therefore, in a case where the tape is not adhered to the annular frame with a uniform tension, it is necessary to exclude it, but it is difficult for an operator to accurately determine, by visual inspection and in a short period of time, whether or not the tape is adhered to the annular frame with a nonuniform tension, so that a countermeasure against this problem has been demanded.

Accordingly, it is an object of the present invention to provide an inspection apparatus by which it is possible to easily determine whether or not a tape is adhered to an annular frame with a uniform tension.

In accordance with an aspect of the present invention, there is provided an inspection apparatus for inspecting the tension of a tape adhered to an annular frame having, in a center thereof, an opening for accommodating a wafer. The inspection apparatus includes a frame support section that supports the annular frame with the tape adhered thereto, a light source that applies light toward the tape, an imaging camera that captures, through the tape, the light applied from the light source, a first polarizing plate disposed between the tape and the light source, and a second polarizing plate that is disposed between the tape and the imaging camera and positioned in such a manner as to shield the light of linearly polarized light transmitted through the first polarizing plate. In a case where distortion is generated in a polarization plane of the light due to application, onto the tape, of the light of the linearly polarized light transmitted through the first polarizing plate, the light is transmitted through the second polarizing plate, and the imaging camera images the transmitted light.

Preferably, the light source is a white light source or a single-wavelength light source.

According to the present invention, the problem that the tape would be adhered to the annular frame with a nonuniform tension and the device chips would be positionally deviated upon division of the wafer supported by the tape into individual device chips, the problem that the devices would fall off, the problem that the tape would be peeled off from the annular frame, and, further, the problem that the device chips could not be properly picked up in a pick-up step, are solved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

An inspection apparatus according to embodiments of the present invention will be described in detail below with reference to the attached drawings.

Figure 1:
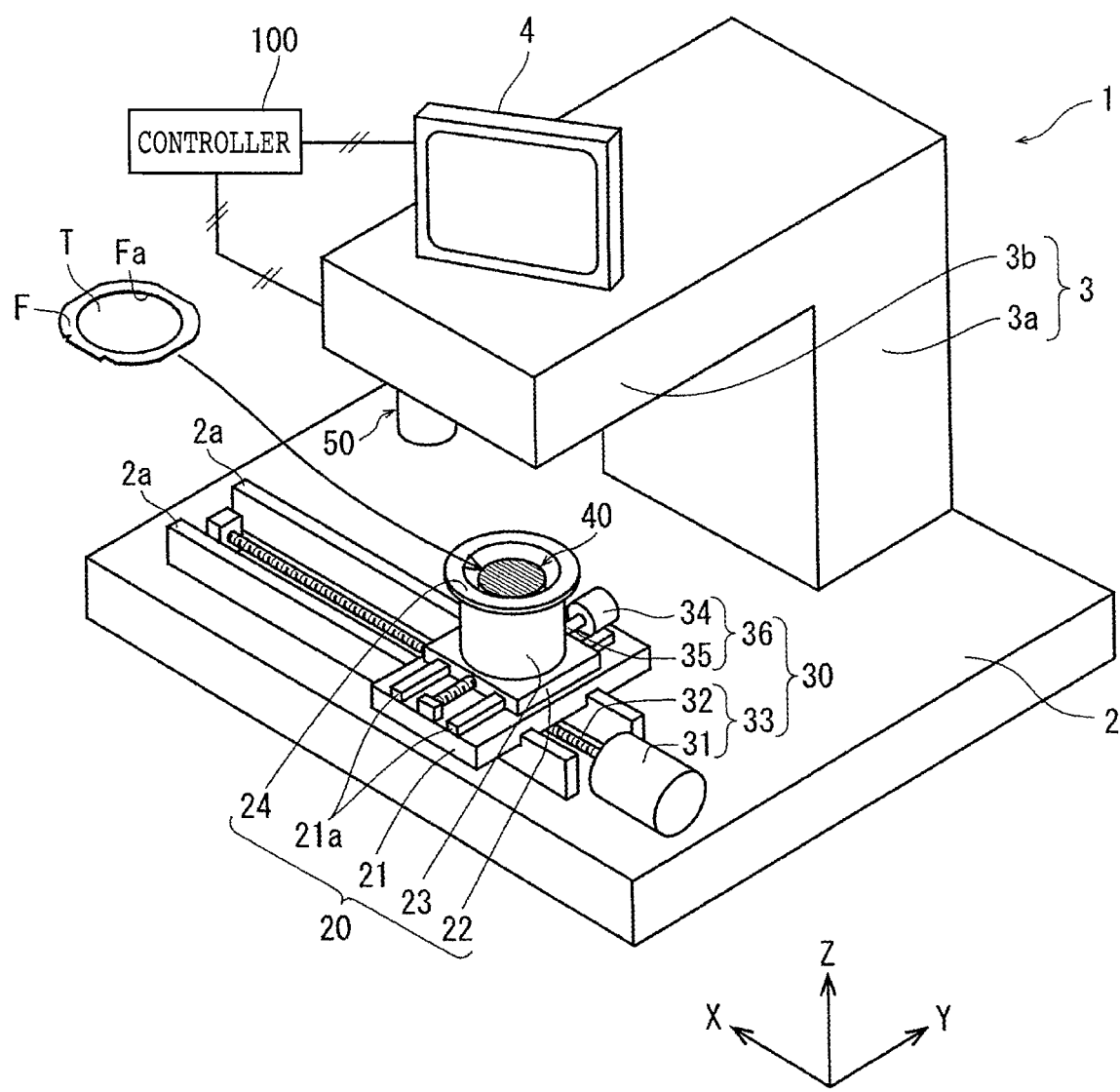
FIG. 1 is a perspective view of the whole part of an inspection apparatus.

FIG. 1 depicts a perspective view of the whole part of an inspection apparatus 1 of the present embodiment. The inspection apparatus 1 is an apparatus for inspecting the tension of a tape T adhered to an annular frame F having, in the center thereof, an opening Fa for accommodating a wafer as illustrated. The inspection apparatus 1 includes a frame support section 24 that supports the annular frame F with the tape T adhered thereto, a light applying assembly 40, and an imaging assembly 50 that captures the light applied from the light applying assembly 40, through the tape T adhered to the annular frame F supported by the frame support section 24.

The frame support section 24 is disposed in a support assembly 20 depicted in FIG. 1. As illustrated in FIG. 1, the support assembly 20 includes a rectangular X-axis direction movable plate 21 mounted on a base 2 in the manner of being movable in an X-axis direction, a rectangular Y-axis direction movable plate 22 mounted on the X-axis direction movable plate 21 in the manner of being movable in the Y-axis direction, and a cylindrical support column 23 fixed to an upper surface of the Y-axis direction movable plate 22. The frame support section 24 which is annular is formed at an upper end of the support column 23. The frame support section 24 has, as a holding surface, an XY plane specified by an X axis and a Y axis, and the holding surface is opened in the center thereof. Note that, in the present embodiment, the light applying assembly 40 is disposed in the support column 23 formed with the frame support section 24.

The inspection apparatus 1 includes a moving mechanism 30 that moves the frame support section 24 in the X-axis direction and the Y-axis direction. The moving mechanism 30 includes an X-axis moving mechanism 33 that moves the frame support section 24 in the X-axis direction and a Y-axis moving mechanism 36 that moves the frame support section 24 in the Y-axis direction. The X-axis moving mechanism 33 converts a rotational motion of a motor 31 into a rectilinear motion and transmits it to the X-axis direction movable plate 21 through a ball screw 32, whereby the X-axis direction movable plate 21 is moved in the X-axis direction along a pair of guide rails 2a disposed on the base 2 along the X-axis direction. The Y-axis moving mechanism 36 converts a rotational motion of a motor 34 into a rectilinear motion and transmits it to the Y-axis direction movable plate 22 through a ball screw 35, whereby the Y-axis direction movable plate 22 is moved in the Y-axis direction along a pair of guide rails 21a disposed on the x-axis direction movable plate 21 along the Y-axis direction.

On a lateral side of the moving mechanism 30 on the base 2, a frame body 3 which includes a vertical wall section 3a and a horizontal wall section 3b extending in a horizontal direction from an upper end part of the vertical wall section 3a is erected. The imaging assembly 50 is disposed at a tip part of the horizontal wall section 3b in a downwardly directed state. A display unit 4 is disposed on an upper surface of the horizontal wall section 3b.

Figure 2:
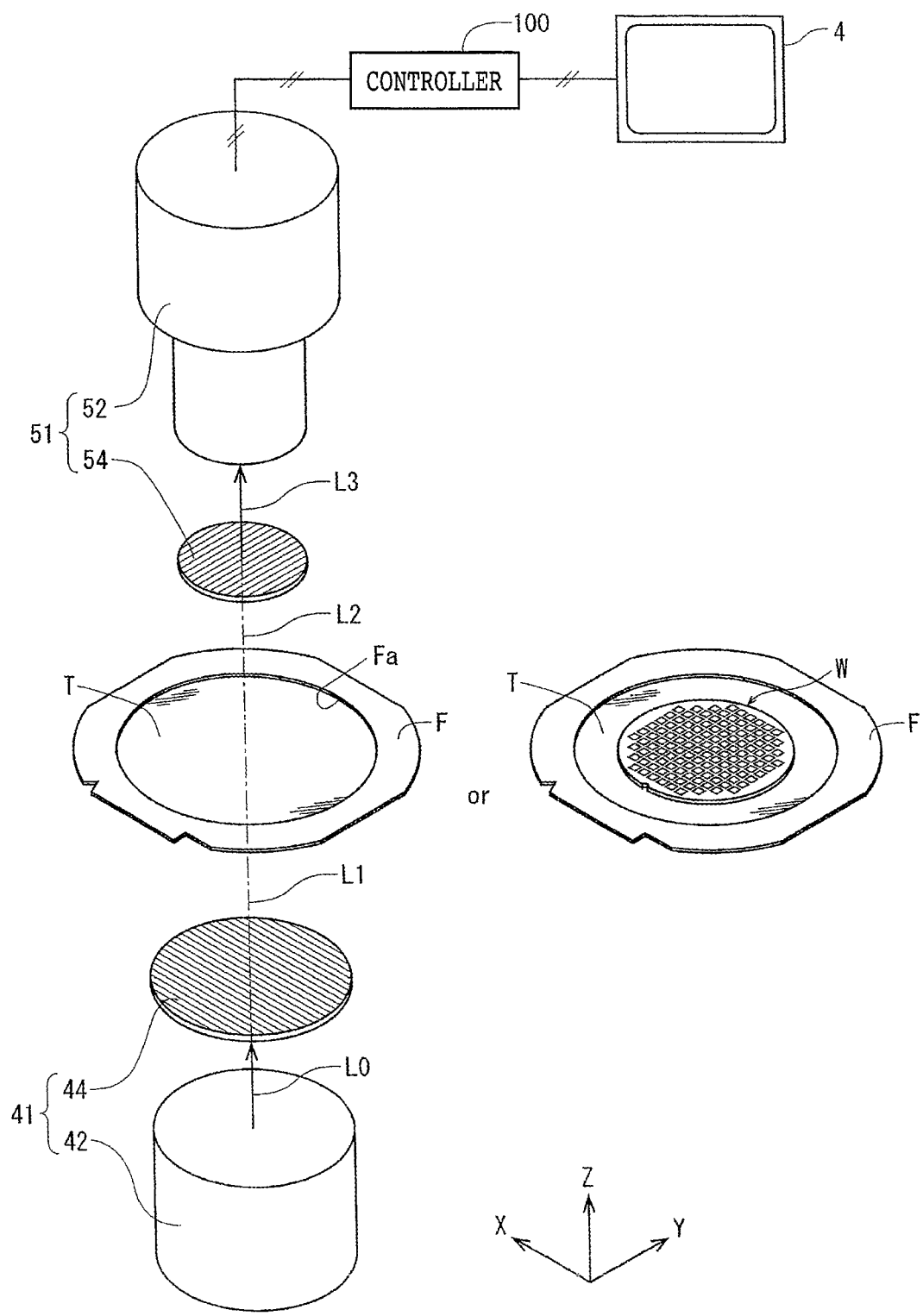
FIG. 2 is a perspective view depicting an optical system of a light application unit and an imaging unit disposed in the inspection apparatus depicted in FIG. 1.

The light applying assembly 40 in the present embodiment includes a light applying unit 41 depicted in FIG. 2. The light applying unit 41 includes a light source 42 that applies light L0 toward the tape T supported by the annular frame F supported by the frame support section 24 and a first polarizing plate 44 disposed between the light source 42 and the tape T. In addition, the imaging assembly 50 includes an imaging unit 51 depicted in FIG. 2. The imaging unit 51 includes an imaging camera 52 that captures, through the tape T, the light L0 applied from the light source 42 and a second polarizing plate 54 disposed between the imaging camera 52 and the tape T.

The first polarizing plate 44 is a polarizing plate that transmits only light polarized in a predetermined direction, of the light L0 applied from the light source 42, and, in the present embodiment, is disposed in such a manner as to transmit only light (linearly polarized light L1) polarized in the X-axis direction in FIG. 2. The linearly polarized light L1 is applied to the tape T adhered to the annular frame F supported by the frame support section 24, and transmitted light L2 transmitted through the tape T is applied to the second polarizing plate 54. The second polarizing plate 54 has a polarization direction rotated by 90 degrees relative to the first polarizing plate 44 such that only the light polarized in the Y-axis direction in FIG. 2 is transmitted therethrough. Note that, though unillustrated, shielding means is disposed such that the light L0 applied from the light source 42 does not enter the imaging camera 52 by passing outside the annular frame F and such that other light than the light L0 of the light source 42 does not enter the imaging camera 52. In addition, the light source 42 of the light applying assembly 40 may be, for example, a white light source including a wide band of wavelengths, or may be a single-wavelength light source such as a light emitting diode (LED).

The display unit 4, the imaging assembly 50, and the moving mechanism 30 are connected to a controller 100 which includes a computer. While the controller 100 is depicted outside the inspection apparatus 1 in the present embodiment for convenience of explanation, in practice, the controller 100 is disposed inside the inspection apparatus 1. An image picked up by the imaging camera 52 is sent to the controller 100, and is displayed on the display unit 4 which is connected to the controller 100. The inspection apparatus 1 in the present embodiment is generally configured as described above, and the functions and actions of the inspection apparatus 1 will be described below.

As depicted in FIG. 2, the inspection apparatus 1 can have, as a body to be inspected, a body obtained by adhering, in a uniting manner, the tape T having an adhesive layer to the annular frame F having, in the center thereof, the opening Fa for accommodating a wafer, or a body obtained by adhering, in a uniting manner, a wafer W as a workpiece to the center of the opening Fa of a body obtained by adhering the tape T to the annular frame F in a uniting manner. In the following description, a case of inspecting, as a workpiece, a body obtained by adhering, in a uniting manner, the tape T to the annular frame having the opening Fa for accommodating the wafer but the wafer is not adhered thereto will be described.

When the above-described body to be inspected is prepared, the body to be inspected is conveyed to the inspection apparatus 1, and is mounted on the frame support section 24. Though not clearly described in the present embodiment, fixing means that sucks or grasps the annular frame F for the purpose of fixing the annular frame F to the frame support section 24 may be provided.

After the annular frame F is mounted on the frame support section 24, the X-axis moving mechanism 33 and the Y-axis moving mechanism 36 are operated, to position the opening Fa of the annular frame F at an inspection position which is directly under the imaging assembly 50. Next, the light source 42 of the light applying assembly 40 described based on FIG. 2 is operated, to apply the light L0 toward the first polarizing plate 44. As described above, the first polarizing plate 44 is a polarizing plate which transmits only the linearly polarized light L1 polarized in the X-axis direction in FIG. 2, of the light L0 applied from the light source 42, and the linearly polarized light L1 transmitted through the first polarizing plate 44 is applied to the tape T exposed in the opening Fa of the annular frame F.

Figure 3A:
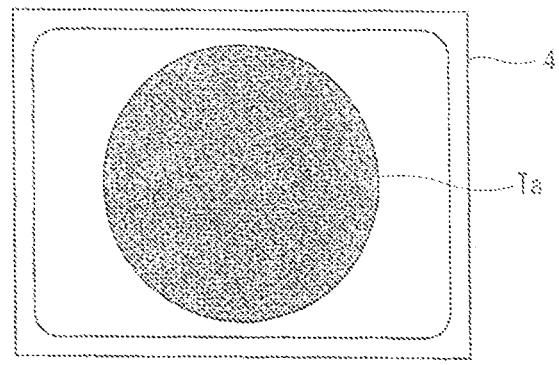
FIG. 3A is a plan view depicting an image obtained in a case where a tape is adhered to an annular frame with a uniform tension.

Here, if the tape T is adhered to the annular frame F with a uniform tension, the linearly polarized light L1 applied to the tape T is transmitted through the tape T without distortion of a polarization plane, to be the transmitted light L2. The transmitted light L2 propagates in a state in which the polarization plane of the linearly polarized light L1 is maintained in the X-axis direction, to be applied to the second polarizing plate 54. As mentioned above, the second polarizing plate 54 is disposed in a state of having the polarization direction rotated by 90 degrees relative to the first polarizing plate 44, so that the transmitted light L2 cannot be transmitted through the second polarizing plate 54 but is shielded by the second polarizing plate 54. FIG. 3A depicts an image obtained by the imaging camera 52 imaging a region Ta of the tape T which is exposed in the opening Fa of the annular frame F in this state. In this state, the transmitted light L2 cannot be captured by the imaging camera 52, so that a state in which the light is not at all captured in the region Ta of the tape T (black state) is displayed on the display unit 4. In other words, in the a where an image depicted in FIG. 3A is displayed by the inspection apparatus 1, it becomes clear, as a result of inspection, that the tape T is adhered to the annular frame F with a uniform tension.

Figure 3B:
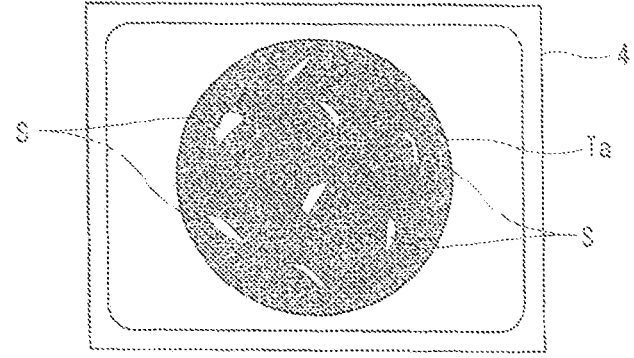
FIG. 3B is a plan view depicting an image obtained in a case where the tape is adhered to the annular frame with a nonuniform tension.

On the other hand, a case where the above-described inspection is carried out when the tape T is adhered to the annular frame F with a nonuniform tension will be described. In a case where the tape T is adhered to the annular frame F with a nonuniform tension, the linearly polarized light L1 incident on the tape T from below by passing through the first polarizing plate 44 becomes the transmitted light L2 including the light which is transmitted through twisted regions adhered to the annular frame F with a nonuniform tension and which has a distorted polarization plane and the light which is transmitted through a region adhered to the annular frame F with a uniform tension and which has a polarization plane maintained. In a case where this transmitted light L2 is applied to the second polarizing plate 54, the light transmitted with the polarization plane maintained, of the transmitted light L2, cannot be transmitted through the second polarizing plate 54 and cannot reach the imaging camera 52; hence, only the light having a distorted polarization plane is transmitted through the second polarizing plate 54, to become final transmitted light L3 and reach the imaging camera 52, so that, as depicted in FIG. 3B, the presence of nonuniform tension regions S is captured by the imaging camera 52 and displayed on the display unit 4. In other words, in a case where such an image as depicted in FIG. 3B is displayed by the inspection apparatus 1, it becomes clear, as a result of inspection, that the tape T is adhered to the annular frame F with a nonuniform tension.

According to the inspection apparatus 1 of the above-described embodiment, in a case where the tape T is adhered to the annular frame F with a nonuniform tension, the state of the nonuniform tension can easily be captured by the imaging camera 52 of the inspection apparatus 1, so that a problem that the tape T is adhered to the annular frame F with the nonuniform tension and device chips would be positionally deviated upon division of the wafer supported by the tape T into individual device chips, a problem that devices would fall off, a problem that the tape would be peeled off from the annular frame, and, further, a problem that the device chips could not be picked up properly in a pick-up step, are solved.

Figure 4A:
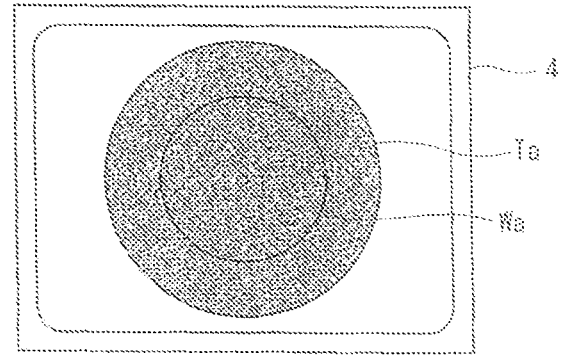
FIG. 4A is a plan view depicting an image obtained in a case where a wafer is adhered to the center of the tape and the tape is adhered to the annular frame with a uniform tension.

The present invention is not limited to the above-described embodiment, and, as depicted at the right in FIG. 2, a body obtained by adhering the tape T to the annular frame F and adhering, in a uniting manner, the wafer W as a workpiece to the center of the opening Fa can also be adopted as a body to be inspected. FIG. 4A depicts an image displayed on the display unit 4 when a body to be inspected in which the tape T is adhered to the annular frame F with a uniform tension and the wafer W is supported in the center of the opening Fa is inspected by the above-described inspection apparatus 1 in the above-described procedure. As understood from FIG. 4A, the transmitted light L2 with the polarization plane maintained when the linearly polarized light L1 is applied to a region Ta in which the tape T adhered with a uniform tension is present, exclusive of a central region Wa to which the wafer W is adhered, is not transmitted through the second polarizing plate, so that the transmitted light L2 cannot be captured by the imaging camera 52, and a state in which the light is not captured is displayed. In other words, in a case where the image depicted in FIG. 4A is displayed by the inspection apparatus 1, it becomes clear, as a result of inspection, that the tape T is adhered to the annular frame F with a uniform tension. Note that the central region Wa of the region Ta in FIG. 4A is displayed as a black state irrespectively of the state of the tension of the tape T adhered to the annular frame F, since the linearly polarized light L1 transmitted through the first polarizing plate 44 is shielded by the wafer W.

Figure 4B:
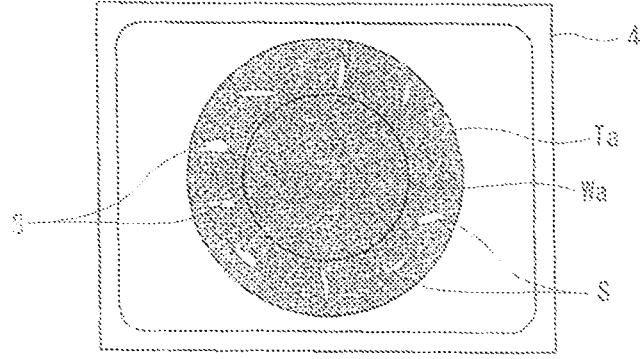
FIG. 4B is a plan view depicting an image obtained in a case where the wafer is adhered to the center of the tape and the tape is adhered to the annular frame with a nonuniform tension.

In addition, FIG. 4B depicts an image displayed on the display unit 4 when a body to be inspected in which the tape T is adhered to the annular frame F with a nonuniform tension and the wafer W is supported in the center is inspected by the above-described inspection apparatus 1. In a case where the tape T is adhered to the annular frame F with a nonuniform tension, the linearly polarized light L1 incident on the tape T from below has the polarization plane distorted when being transmitted through the twisted regions adhered to the annular frame F with the nonuniform tension. Of the transmitted light L2 including the light having the distorted polarization plane and the light which is transmitted through a region adhered to the annular frame F with a uniform tension and which has the polarization plane maintained, the light having the distorted polarization plane is transmitted through the second polarizing plate 54, to become the final transmitted light L3 and reach the imaging camera 52, so that, as depicted in FIG. 4B, an image including the nonuniform tension regions S is displayed on the display unit 4. Hence, it becomes clear, as a result of inspection, that the tape T is adhered to the annular frame F with a nonuniform tension, and effects similar to those obtained in the embodiment described above can be obtained.

In the above-described embodiment, an example in which the light applying unit 41 including the light source 42 and the first polarizing plate 44 and the imaging unit 51 including the imaging camera 52 and the second polarizing plate 54 are disposed on the upper and lower sides of the tape T as a body to be inspected such that the tape T is interposed therebetween, as a specific configuration for capturing the light applied from the light source by the imaging camera through the tape in the present invention, but the present invention is not limited to this configuration. Based on FIGS. 5 to 6B, another embodiment in which the light applied from the light source is captured by the imaging camera through the tape will be described.

Figure 5:
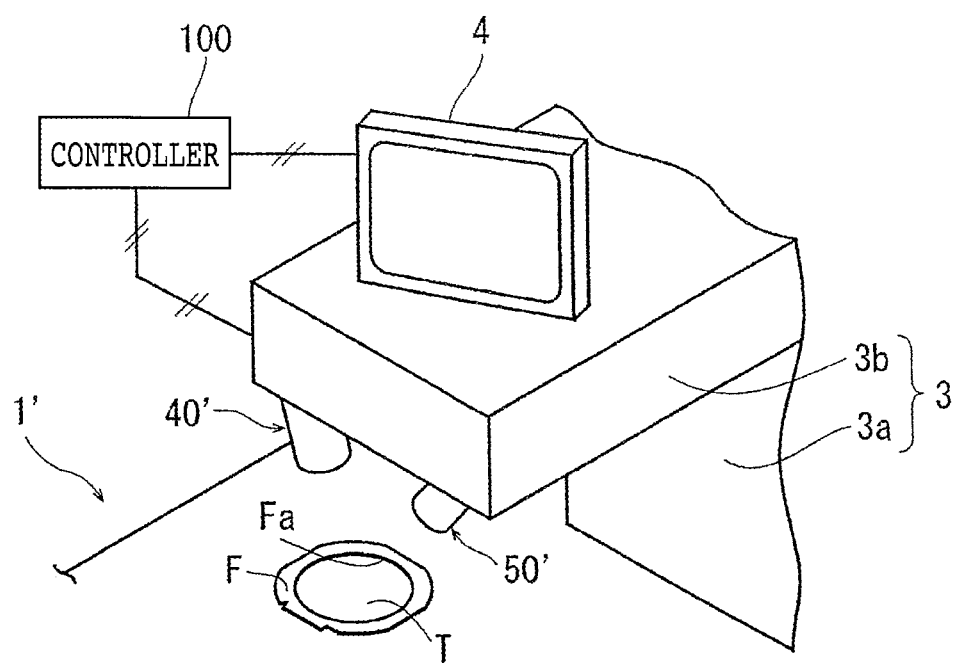
FIG. 5 is a perspective view depicting another embodiment of the inspection apparatus.

FIG. 5 depicts a part of an inspection apparatus 1' which is another embodiment of the present invention. The inspection apparatus 1' has roughly the same configurations as those in the inspection apparatus 1 depicted in FIG. 1, and the same configurations as those in the inspection apparatus 1 depicted in FIG. 1 are omitted in illustration.

Figures 6A, 6B:
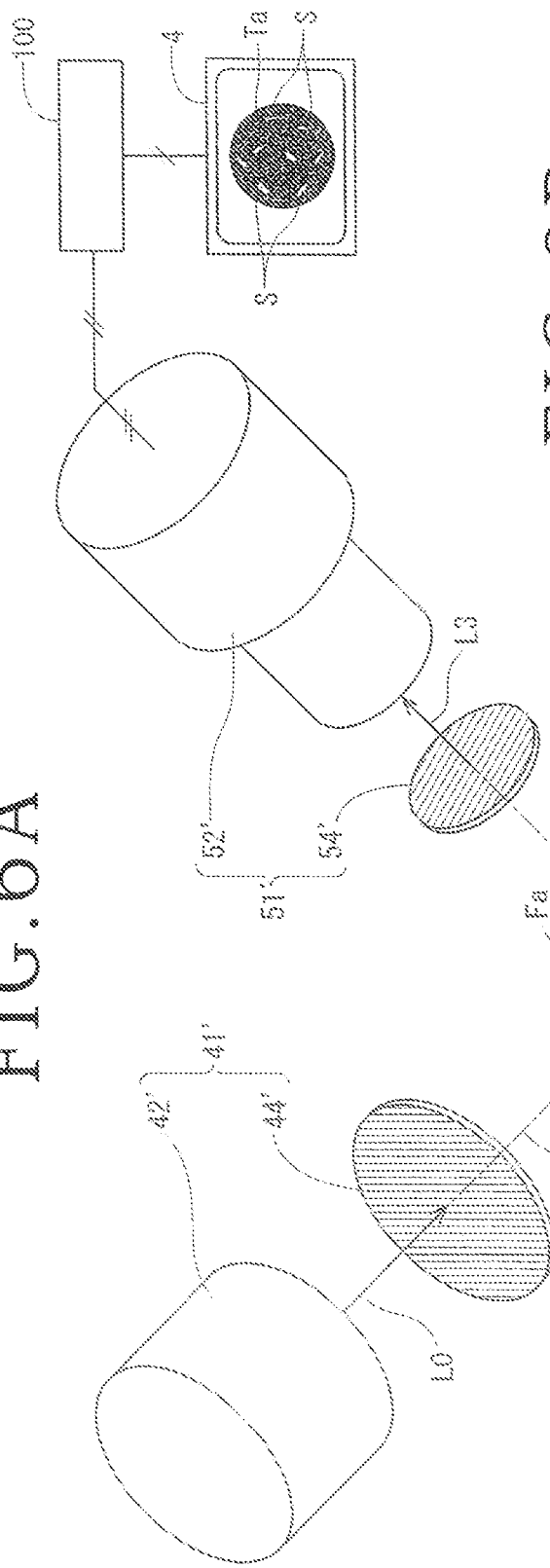
FIG. 6A is a perspective view depicting an optical system of a light applying unit and an imaging unit of the inspection apparatus depicted in FIG. 5.
FIG. 6B is a partially omitted plan view of the optical system depicted in FIG. 6A.

In the inspection apparatus 1', there are disposed a light applying assembly 40' and an imaging assembly 50', in place of the light applying assembly 40 and the imaging assembly 50 of the inspection apparatus 1 described above. As depicted in FIG. 5, the light applying assembly 40' and the imaging assembly 50' are disposed at a tip part of the horizontal wall section 3b of the frame body 3. The light applying assembly 40' includes a light applying unit 41' depicted in FIG. 6A, and the light applying unit 41' includes a light source 42' and a first polarizing plate 44'. The light source 42' is a light source equivalent to the above-described light source 42, and applies light L0 toward the tape T adhered to the annular frame F mounted on the frame support section 24 (omitted in illustration), at a predetermined incidence angle. The first polarizing plate 44' is disposed between the light source 42' and the tape T, and, as understood from FIG. 6B which is a plan view of viewing a part of FIG. 6A from above, is a polarizing plate that transmits only light (linearly polarized light L1) polarized in a predetermined direction, for example, the Y-axis direction in FIG. 6B, of the light L0 applied from the light source 42'. In addition, an imaging assembly 50' includes an imaging unit 51' depicted in FIG. 6A, and the imaging unit 51' includes an imaging camera 52' and a second polarizing plate 54'. The second polarizing plate 54' is positioned between the imaging camera 52' and the tape T, and is a polarizing plate that transmits only the light polarized in the X-axis direction in FIG. 6B, as depicted in FIG. 6B. The imaging camera 52' and the second polarizing plate 54' constituting the imaging unit 51' are disposed in the direction of a reflection angle corresponding to the incidence angle of the light applied from the light source 42' toward the tape T.

In performing inspection in the inspection apparatus 1 depicted in FIG. 5, first, the body to be inspected is mounted on the unillustrated frame support section 24, and, as depicted in FIG. 6A, is moved to a position directly under the light applying assembly 40' and the imaging assembly 50'. Next, the light source 42' is operated to apply the light L0 toward the first polarizing plate 44'. As described above, the first polarizing plate 44' is a polarizing plate that transmits only the linearly polarized light L1 polarized in the Y-axis direction in FIG. 6B, of the light L0 applied from the light source 42', and the linearly polarized light L1 transmitted through the first polarizing plate 44' is applied to the tape T exposed in the opening Fa of the annular frame F, at a predetermined incidence angle.

The linearly polarized light L1 applied to the tape T adhered to the annular frame F is applied to the second polarizing plate 54' as reflected light L2 reflected at a reflection angle corresponding to the above-mentioned predetermined incidence angle on the tape T. As described above, the second polarizing plate 54' has the polarization direction rotated by 90 degrees in such a manner as to transmit only the light polarized in the X-axis direction in FIG. 6B. Note that, though not illustrated, appropriate light shielding means that prevents the light L0 applied from the light source 42' from being reflected in a region outside of the tape T and reaching the imaging camera 52' and prevents other light than the light L0 applied from the light source 42' from entering the imaging camera 52' may be disposed.

Here, if the tape T is adhered to the annular frame F with a uniform tension, the linearly polarized light L1 applied to the tape T is reflected without distortion of the polarization plane, to become the reflected light L2. This reflected light L2 propagates toward the imaging unit 51' with the polarization plane of the linearly polarized light L1 maintained in the Y-axis direction, and is applied to the second polarizing plate 54'. As described above, the second polarizing plate 54' has the polarization plane rotated by 90 degrees relative to the first polarizing plate 44'. Hence, in a case where the light made to be the linearly polarized light L1 by the first polarizing plate 44' is reflected without distortion of the polarization plane by the tape T, the reflected light L2 cannot be transmitted through the second polarizing plate 54', but is shielded by the second polarizing plate 54'. By imaging, in this state, the region Ta of the tape T exposed in the opening Fa of the annular frame F, by the imaging camera 52' and performing shape correction to cause the region Ta to be a circular shape, the image depicted in FIG. 3A can be obtained. In the present embodiment, since the linearly polarized light L1 reflected in the tape is not transmitted through the second polarizing plate 54', the reflected light L2 cannot be captured by the imaging camera 52', and a state in which the light is not captured (black state) is displayed in the display unit 4. In other words, the image depicted in FIG. 3A is displayed on the display unit 4 by the inspection apparatus 1', and it becomes clear, as a result of inspection, that the tape T is adhered to the annular frame F with the uniform tension.

On the other hand, in a case where the tape T is adhered to the annular frame F in the body to be inspected with a nonuniform tension, the linearly polarized light L1 applied to the tape T through the first polarizing plate 44' becomes the reflected light L2 including the light which is reflected in the twisted regions adhered to the annular frame F with the nonuniform tension and has the distorted polarization plane and the light which is reflected in the region adhered to the annular frame F with the uniform tension and has the polarization plane maintained. When this reflected light L2 is applied to the second polarizing plate 54', the light reflected with the polarization plane maintained, of the reflected light L2, cannot be transmitted through the second polarizing plate 54' and does not reach the imaging camera 52', whereas the light having the distorted polarization plane is transmitted through the second polarizing plate 54' and reaches the imaging camera 52' as the final reflected light L3. In this way, based on the light having the distorted polarization plane, the presence of nonuniform tension regions S is captured by the imaging camera 52', and such an image as depicted in FIG. 3B is displayed on the display unit 4, so that it becomes clear, as a result of inspection, that the tape T is adhered to the annular frame with the nonuniform tension.

According to the another embodiment just described, also, similarly to the formerly described embodiment, in a case where the tape T is adhered to the annular frame F with a nonuniform tension, the state of the nonuniform tension can easily be captured, so that a problem that the wafer supported with the tape T adhered to the annular frame F with the nonuniform tension would be divided into individual device chips and the device chips would be positionally deviated, a problem that the devices would fall off, a problem that the tape would be peeled off from the annular frame, and, further, a problem that the device chips could not be properly picked up in a pick-up step, are solved.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An inspection apparatus for inspecting a tension of a tape adhered to an annular frame having, in a center thereof, an opening for accommodating a wafer, the inspection apparatus comprising:
a frame support section that supports the annular frame with the tape adhered thereto;
a light source that applies light toward the tape;
an imaging camera that captures, through the tape, the light applied from the light source;
a first polarizing plate disposed between the tape and the light source; and
a second polarizing plate that is disposed between the tape and the imaging camera and positioned in such a manner as to shield the light of linearly polarized light transmitted through the first polarizing plate,
wherein, in a case where distortion is generated in a polarization plane of the light due to application, onto the tape, of the light of the linearly polarized light transmitted through the first polarizing plate, the light is transmitted through the second polarizing plate, and the imaging camera images the transmitted light; and,
wherein, only where the tape has at least one nonuniform tension region, the imaging camera captures the light applied from the light source, and where the tape has uniform tension, the light applied by the light source is shielded by the first polarizing plate and the second polarizing plate and cannot be captured by the imaging camera.

2. The inspection apparatus according to claim 1, wherein the light source is a white light source or a single-wavelength light source.

3. The inspection apparatus according to claim 1, further comprising a display unit that displays nonuniform tension regions of the tape captured by the imaging camera.

4. The inspection apparatus according to claim 1, wherein the first polarizing plate is aligned at a first axis and the second polarizing plate is aligned at a second axis, the second axis being perpendicular to the first axis.

* * * * *